(12) United States Patent
Lee (10) Patent No.: US 7,423,896 B2
(45) Date of Patent: *Sep. 9, 2008

(54) LOCAL SENSE AMPLIFIER IN MEMORY DEVICE

(75) Inventor: Sang-Bo Lee, Yongin-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 11/789,395

(22) Filed: Apr. 24, 2007

(65) Prior Publication Data

US 2007/0195625 A1    Aug. 23, 2007

Related U.S. Application Data

(63) Continuation of application No. 11/179,408, filed on Jul. 12, 2005, now Pat. No. 7,236,414.

(30) Foreign Application Priority Data

Jul. 13, 2004   (KR) ............... 2004-54490

(51) Int. Cl.
*G11C 5/06* (2006.01)
(52) U.S. Cl. .................. 365/63; 365/203; 365/205
(58) Field of Classification Search ............ 365/63, 365/203, 205
See application file for complete search history.

(56) References Cited

U.S. PATENT DOCUMENTS 7,236,414 B2 *   6/2007   Lee .................... 365/205

* cited by examiner

*Primary Examiner*—Hoai V Ho
(74) *Attorney, Agent, or Firm*—Monica H. Choi

(57) ABSTRACT

A memory device includes a decoder that sets an operational control signal and a column select line signal at a first logical level simultaneously. In addition, a local sense amplifier has at least one switching device that is turned on by the operational control signal that is at the first logical level to couple at least one local I/O line to at least one global I/O line. Furthermore, signal lines, that are disposed to be parallel, transmit the operational control signal and the column select line signal from the decoder.

19 Claims, 10 Drawing Sheets

LOCAL SENSE AMPLIFIER IN MEMORY DEVICE

The present application is a continuation application of an earlier filed patent application with Ser. No. 11/179,408 filed on Jul. 12, 2005, issued as U.S. Pat. No. 7,236,414, for which priority is claimed. This earlier filed patent application with Ser. No. 11/179,408 is in its entirety incorporated herewith by reference.

The present application also claims priority under 35 USC §119 to Korean Patent Application No. 2004-54490, filed on Jul. 13, 2004, in the Korean Intellectual Property Office, the disclosure of which is incorporated herein in its entirety by reference. A certified copy of Korean Patent Application No. 2004-54490 is contained in the parent copending patent application with Ser. No. 11/179,408.

BACKGROUND OF THE INVENTION

1. Field of the Invention

The present invention relates generally to memory devices, and more particularly, to a local sense amplifier with improved operating frequency in a semiconductor memory device.

2. Description of the Related Art

Increase in chip size of a semiconductor memory device results in increased length and thus capacitance of a data line. Such increased capacitance results in higher delay for transmission of data through the data line. To address this problem, a current sense amplifier, which is not affected by the capacitance of the data line, is used in a semiconductor memory device.

The current sense amplifier advantageously does not create a voltage difference on the data lines. Thus, the data lines need not be synchronized, even when different data are consecutively transmitted. Also, the current sense amplifier operates normally even when the semiconductor memory device operates at high speed.

However, the current sense amplifier must be consistently supplied with a current to make a virtual short along an input/output (I/O) line. Thus, the current sense amplifier requires more current to operate than a voltage sense amplifier. For this reason, the current sense amplifier may not be practical for a memory device used in mobile communication equipment that must operate at high speed with less power consumption.

Figure 1:
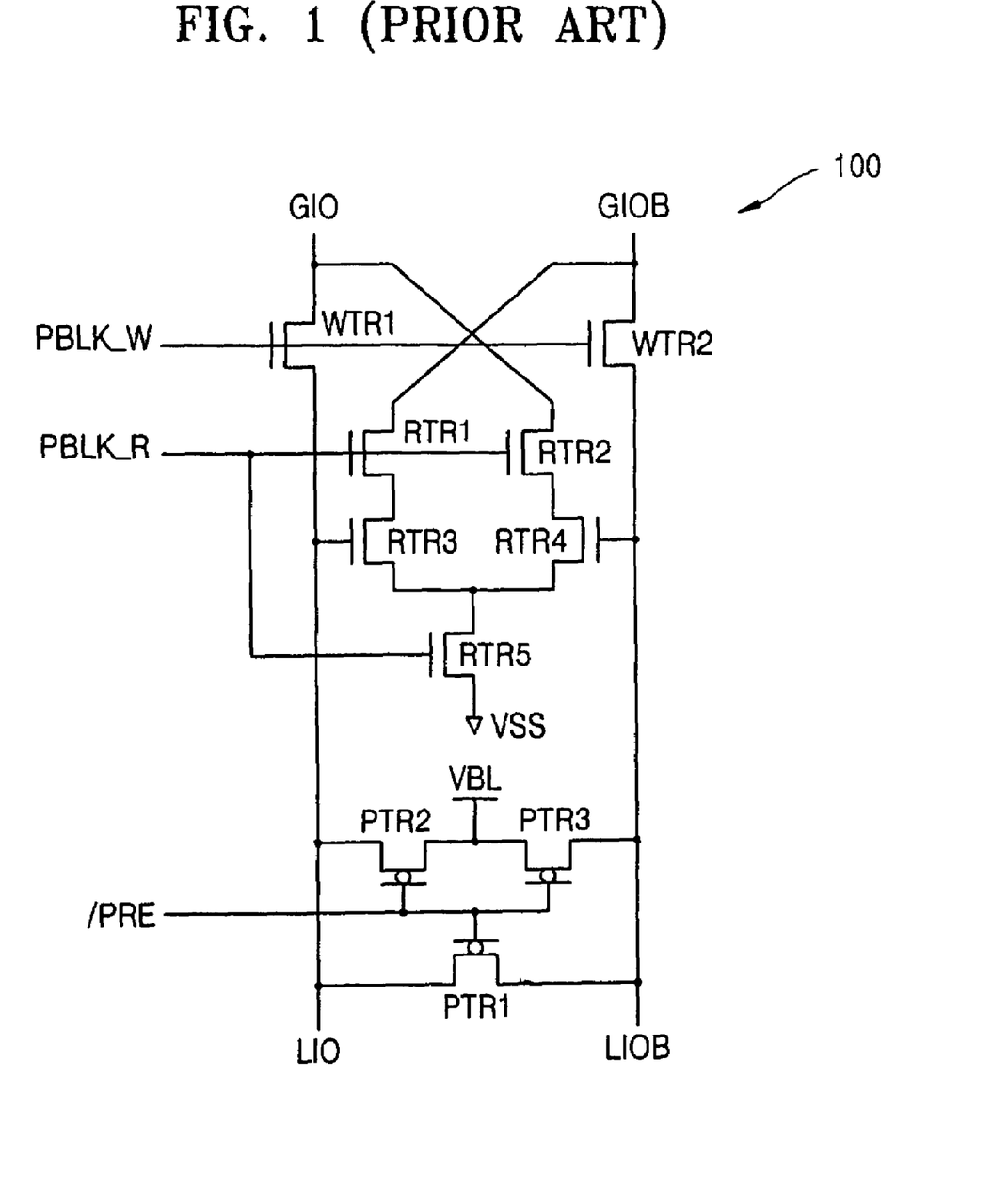
FIG. 1 is a circuit diagram of a conventional local sense amplifier.
Figure 2:
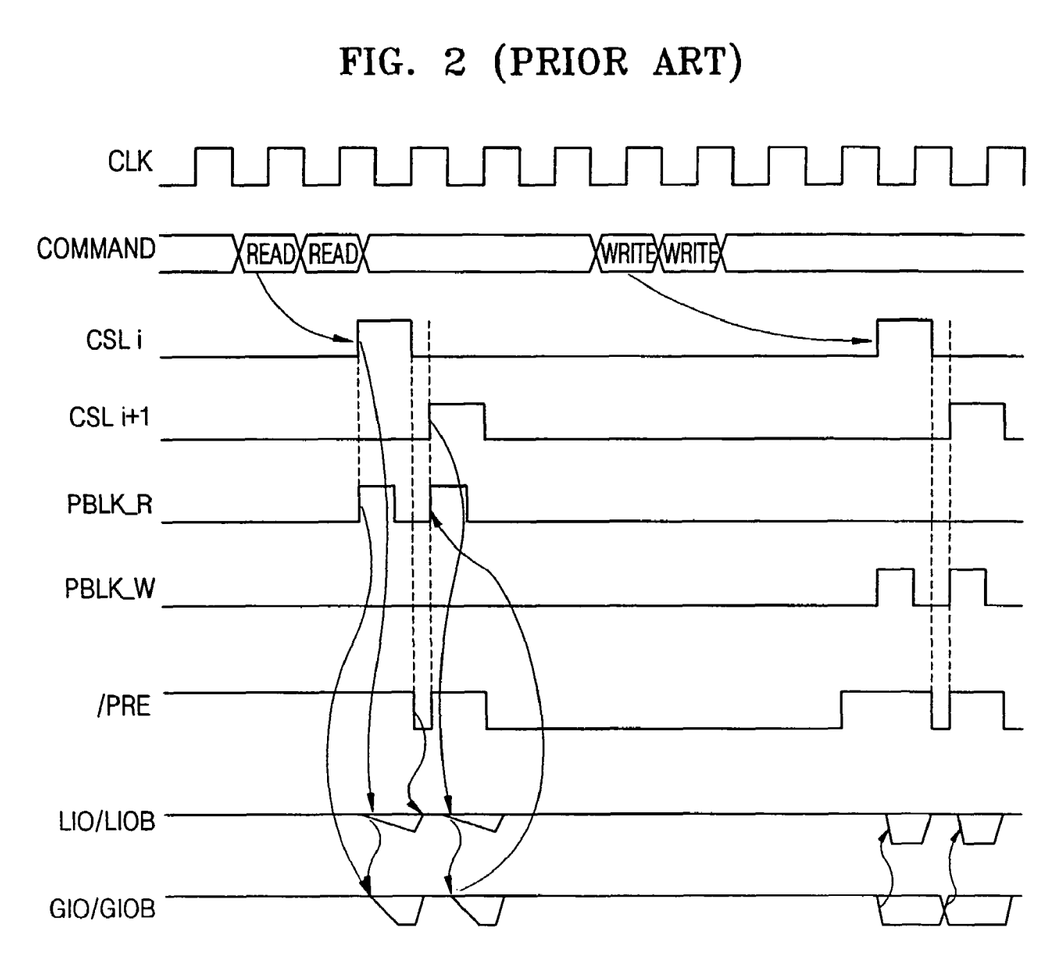
FIG. 2 shows a timing diagram illustrating operation of the conventional local sense amplifier of FIG. 1.

When a voltage sense amplifier is used in a memory device that has a hierarchical I/O line structure, a local sense amplifier is installed between local I/O lines and global I/O lines to increase the operating speed of the memory device. FIG. 1 shows a circuit diagram of a conventional local sense amplifier 100. FIG. 2 shows a timing diagram of signals during operation of the local sense amplifier 100 of FIG. 1.

The local sense amplifier 100 includes read transistors RTR1, RTR2, RTR3, RTR4, and RTR5 that transmit read data, write transistors WTR1 and WTR2 that transmit write data, and precharge transistors PTR1, RTR2, and PTR3 that precharge a pair of local I/O lines LIO and LIOB.

During a read operation, a column select line signal CSL is activated to a logical high level. The activated CSL signal allows transmission of data amplified by a bit-line sense amplifier (not shown) to the pair of local I/O lines LIO and LIOB. The data transmitted to the pair of local I/O lines LIO and LIOB is amplified by the local sense amplifier 100 and transmitted to a pair of global I/O lines GIO and GIOB.

The time at which the local sense amplifier 100 amplifies and transmits the data to the pair of global I/O lines GIO and GIOB is controlled by a read control signal PBLK_R. When the read control signal PBLK_R is activated to the logical high level, the read transistors RTR1, RTR2, and RTR5 are turned on to transmit the amplified data to the pair of global I/O lines GIO and GIOB.

As shown in FIG. 2, the read control signal PBLK_R is activated at almost the exact same time as the column select line signal CSL. The read control signal PBLK_R activates a respective local sense amplifier corresponding to a memory block selected by a word line.

That is, only a local sense amplifier located in a region of a selected memory block operates. When the read control signal PBLK_R is activated after activation of the column select line signal CSL, data access is delayed between activation of the CSL signal and the activation of the read control signal PBLK_R.

In contrast, when the read control signal PBLK_R is activated before activation of the CSL signal, data is transmitted through the local sense amplifier 100 before valid data is applied on the pair of local I/O lines LIO and LIOB. Thus, invalid data is transmitted to the pair of global I/O lines GIO and GIOB with unnecessary power consumption.

Accordingly, in the conventional local sense amplifier 100, the read control signal PBLK_R and the CSL signal should be activated at the exact same time for proper operation.

Figure 3:
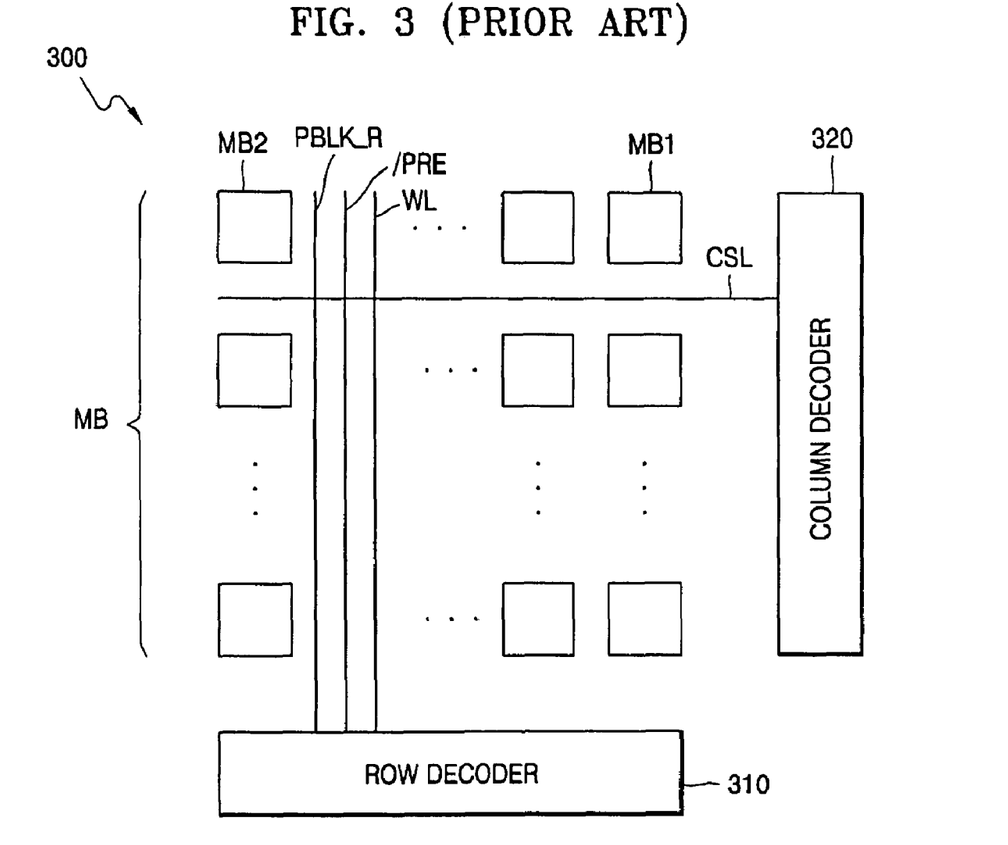
FIG. 3 is a block diagram of a conventional memory device.

FIG. 3 is a block diagram of a conventional memory array 300. The conventional memory array 300 includes a row decoder 310, a column decoder 320, and a plurality of memory blocks MB. Although not shown in FIG. 3, each local sense amplifier 100 of FIG. 1 is installed at a junction between a respective bit-line sense amplifier (not shown) and a respective sub word line driver (not shown) of a respective memory block MB.

Referring to FIG. 3, using a row address, a read control signal PBLK_R is transmitted in the direction of a word line WL after a predetermined delay, while a column select line signal CSL is transmitted perpendicular to the word line WL. Thus, even if the memory array 300 is designed such that both the read control signal PBLK_R and the column select line signal CSL are activated at exactly the same time for a memory block MB1, these signals PBLK_R and CSL are inevitably activated at different times within another memory block MB2.

Such signals PBLK_R and CSL are activated at different times within different memory blocks because of differences in the delay of such signals PBLK-R and CSL reaching each memory block. That is, it is difficult to activate the column select line signal CSL and the read control signal PBLK_R simultaneously within every memory block MB. Consequently, the operating frequency range of the memory array 300 is limited.

This problem becomes worse for a precharge control signal /PRE that precharges the pair of local I/O lines LIO and LIOB. When read operations are continuously performed, one column select line signal CSLi is deactivated and another column select line signal CSLi+1 is activated.

Generally, the precharge control signal /PRE pulse needs to precharge the pair of local I/O lines LIO and LIOB after the column select line signal CSLi is deactivated and before the next column select line signal CSLi+1 is activated. Thus, the precharge control signal /PRE pulse must be generated with sufficient pulse width precisely between the activation of the column select line signal CSLi and the next column select line signal CSLi+1.

When the precharge control signal /PRE pulse is generated before deactivation of the prior column select line signal CSLi, a current path is formed between the pair of local I/O lines LIO and LIOB and a bit-line sense amplifier (not shown), thereby causing unnecessary power consumption. On the other hand, when generation of the precharge control signal /PRE pulse overlaps activation of the next column select line signal CSLi+1, a current path is formed between the bit-line sense amplifier and precharge transistors PTR1, PTR2, and PTR3 along the pair of local I/O lines LIO and LIOB of the local sense amplifier 100. The current path causes unnecessary power consumption, and moreover, delays data access through the local sense amplifier 100.

The precharge control signal /PRE is transmitted in the direction of the word line WL, but the column select line signal CSL is transmitted perpendicular to the word line WL. Thus, even if the precharge control signal /PRE pulse is generated simultaneously with activation of the column select line signal CSL within the memory block MB1, the precharge control signal /PRE pulse may not be generated simultaneously with activation of the column select line signal CSL within the another memory block MB2. That is, it is difficult to generate the precharge control signal /PRE pulse with simultaneous activation of the column select line signal CSL within every memory block MB. Consequently, the operating frequency range of the memory array 300 is limited.

Figure 4:
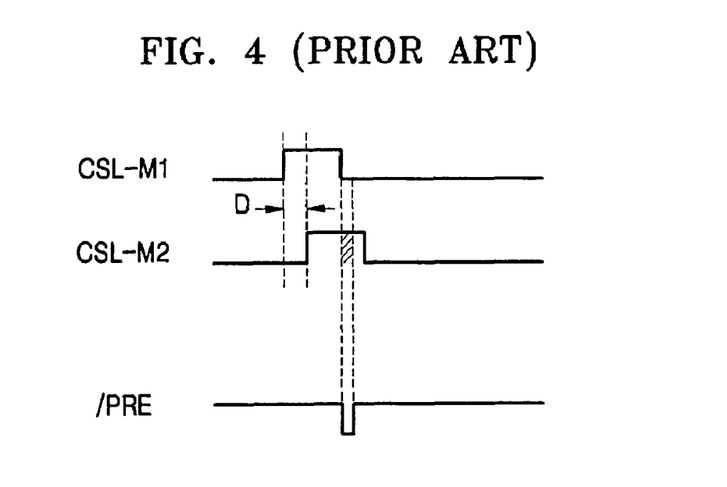
FIG. 4 shows a timing diagram illustrating misalignment between generation of a precharge control signal pulse and activation of a column select line signal, according to the prior art.

FIG. 4 illustrates a discrepancy between the time when a precharge control signal /PRE pulse is generated and the time when a column select line signal CSL is activated. There is a time delay D between the activated column select line signal CSL reaching the first memory block MB1 and the second memory block MB2. Thus, if the precharge control signal /PRE pulse is generated when the column select line signal CSL is deactivated at the first memory block MB1, the precharge control signal /PRE pulse may be generated when the column select line signal CSL is still activated at the second memory block MB2.

Similarly, during a write operation, a write control signal PBLK_W is activated to connect the pair of global I/O lines GIO and GIOB and the pair of local I/O lines LIO and LIOB of FIG. 1. Since the pair of global I/O lines GIO and GIOB reach full swing during the write operation, it is possible to transmit data using only the write transistors WTR1 and WTR2 of FIG. 1 without an additional amplifier.

The write control signal PBLK_W should also be activated simultaneously with the column select line signal CSL at each memory block. Therefore, the time when the write control signal PBLK_W is activated must be adjusted precisely. However, since the write control signal PBLK_W is also transmitted perpendicular to the column select line signal CSL, it is difficult to activate the write control signal PBLK_W and the column select line signal CSL simultaneously at each memory block.

SUMMARY OF THE INVENTION

Accordingly, a local sense amplifier of a memory device is controlled by an operational control signal and a column select line signal that are transmitted along a parallel direction.

In an aspect of the present invention, a memory device includes a decoder that sets an operational control signal and a column select line signal at a first logical level simultaneously. In addition, the memory device includes a local sense amplifier having at least one switching device that is turned on by the operational control signal that is at the first logical level to couple at least one local I/O line to at least one global I/O line. Furthermore, the memory device includes signal lines that are disposed to be parallel and that transmit the operational control signal and the column select line signal from the decoder.

In another embodiment of the present invention, the memory device further includes a bit line sense amplifier that couples a respective at least one bit line to the at least one local I/O line when the column select line signal is at the first logical level.

In a further embodiment of the present invention, the at least one switching device includes a pair of enable transistors that are turned on when the operational control signal is at the first logical level to couple read data between a pair of local I/O lines and a pair of global I/O lines for a read operation. In that case, the local sense amplifier further includes a read select transistor that is turned on when a read block select signal is at the first logical level as the operation control signal is at the first logical level for the read operation.

In yet another embodiment of the present invention, the at least one switching device includes another pair of enable transistors that are turned on when the operational control signal is at the first logical level to couple write data between a pair of local I/O lines and a pair of global I/O lines for a write operation. In that case, the local sense amplifier further includes write select transistors that are turned on when a write block select signal is at the first logical level as the operation control signal is at the first logical level for the write operation.

In a further embodiment of the present invention, the local sense amplifier further includes at least one precharge switching device that is turned on when the operation control signal is at a second logical level for precharging the at least one local I/O line.

In this manner, the operational control signal and the column select line signal are at the first logical level simultaneously at each of the memory blocks. Thus, the memory device may operate at higher frequencies and with lower power consumption.

BRIEF DESCRIPTION OF THE DRAWINGS

The above and other features and advantages of the present invention will become more apparent when described in detailed exemplary embodiments thereof with reference to the attached drawings in which.

The figures referred to herein are drawn for clarity of illustration and are not necessarily drawn to scale. Elements having the same reference number in FIGS. 1, 2, 3, 4, 5, 6, 7, 8, 9, 10,11, and 12 refer to elements having similar structure and/or function.

DETAILED DESCRIPTION OF THE INVENTION

Figure 5:
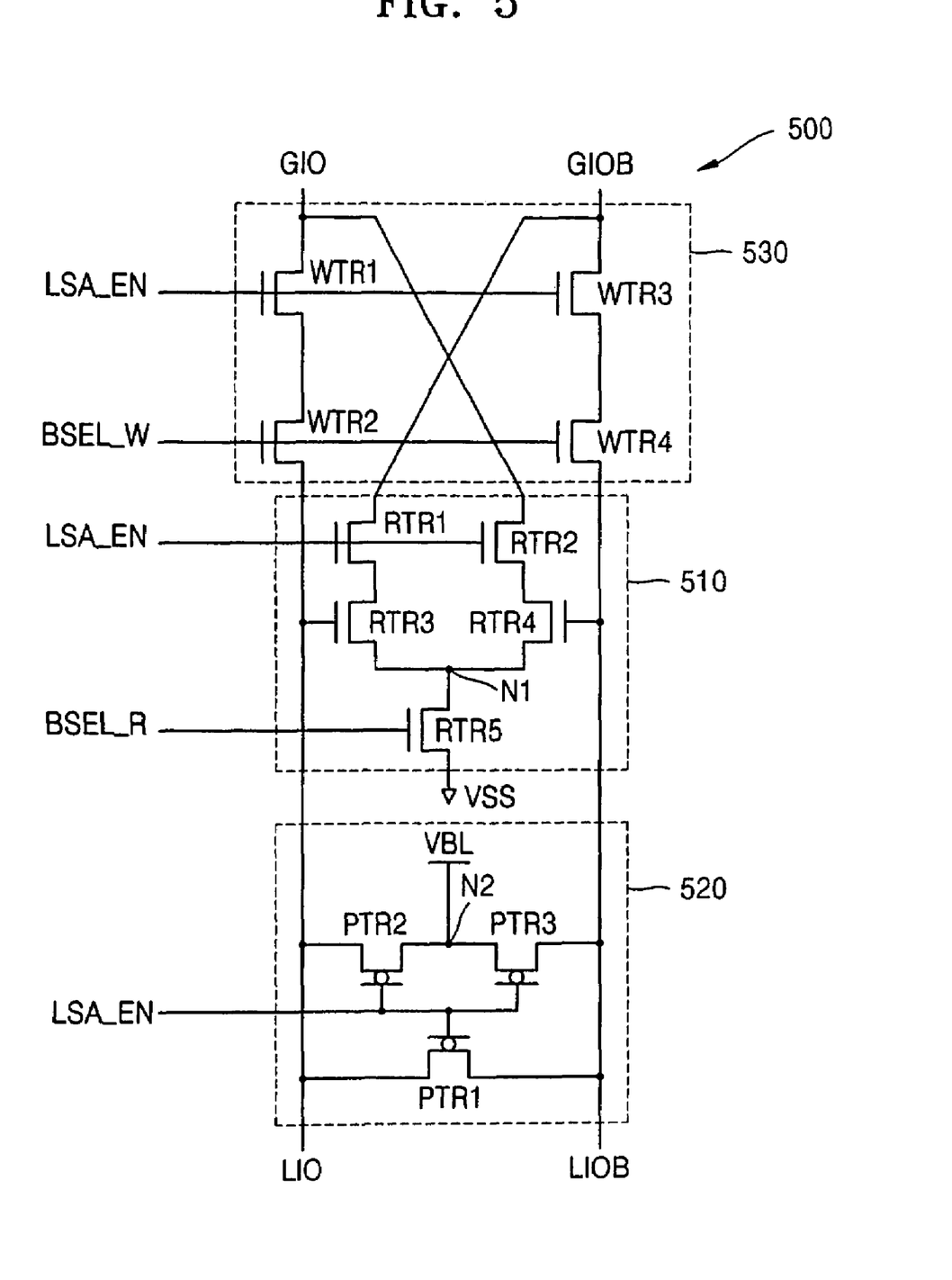
FIG. 5 is a circuit diagram of a local sense amplifier, according to an embodiment of the present invention.
Figure 6:
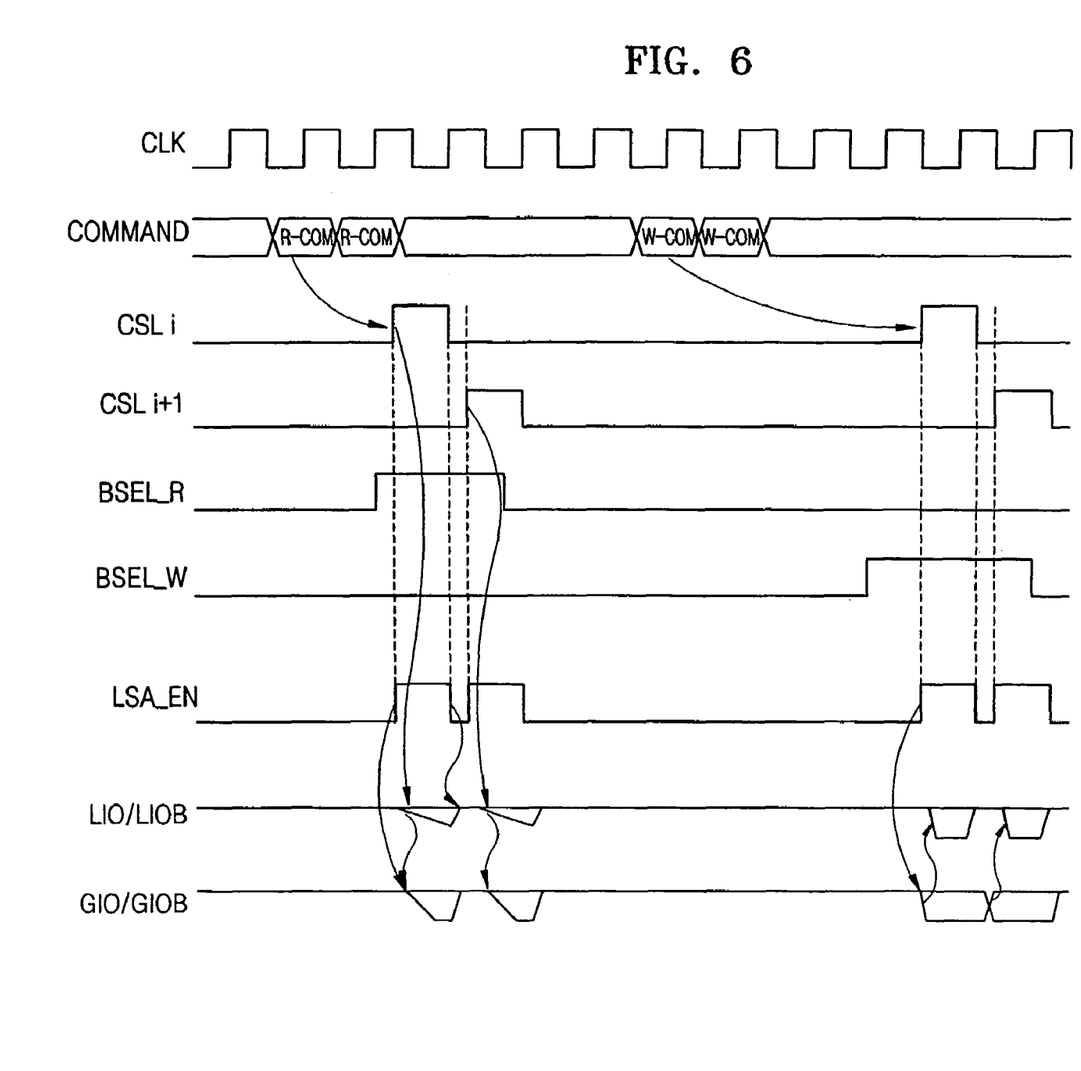
FIG. 6 shows a timing diagram illustrating operation of the local sense amplifier of FIG. 5, according to another embodiment of the present invention.

FIG. 5 shows a circuit diagram of a local sense amplifier 500 according to an embodiment of the present invention. FIG. 6 shows a timing diagram of signals during operation of the local sense amplifier 500 of FIG. 5.

The local sense amplifier 500 includes a read data transmission unit 510, a precharge controller 520, and a write data transmission unit 530. The read data transmission unit 510 transmits data of a pair of local input/output (I/O) lines LIO and LIOB to a pair of global I/O lines GIO and GIOB, when a read block selection signal BSEL_R and an operation control signal LSA_EN are at a first logical level.

The precharge controller 520 precharges the pair of local input/output (I/O) lines LIO and LIOB when the operation control signal LSA_EN is at a second logical level. The write data transmission unit 530 transmits data of the pair of global I/O lines GIO and GIOB to the pair of local I/O lines LIO and LIOB when a write block selection signal BSEL_W and the operation control signal LSA_EN are at the first logical level.

The local sense amplifier 500 operates in response to a signal that enables selection of a memory block from which data is to be read or to which data is to be written, and a signal that enables a read operation or a write operation.

During the read operation, the read block selection signal BSEL_R turns on a fifth read transistor RTR5 (i.e., a read select transistor) so that the read data transmission unit 510 is ready for data transmission. The read block selection signal BSEL_R of FIG. 5 is different from the read control signal PBLK_R of FIG. 1. Specifically, the read block selection signal BSEL_R of FIG. 1 should be activated simultaneously with the activation of the column select line signal CSL.

In contrast, the read block selection signal BSEL_R of FIG. 5 is used just to select a memory block from which data is to be read and thus is just activated during the read operation. Thus, the operating frequency range of the local sense amplifier 500 is not restricted by the timing requirement of the read block selection signal BSEL_R.

The read block selection signal BSEL_R is generated using a combination of a row address signal and a read command. In addition, the read block selection signal BSEL_R is activated simultaneously with or prior to the generation of the column select line signal CSL.

The operation control signal LSA_EN controls the local sense amplifier 500 to start performing a read operation or a write operation. The operation control signal LSA_EN is activated or deactivated simultaneously with the column select line signal CSL that connects a respective pair of bit lines (not shown) and the pair of local I/O lines LIO and LIOB.

Also, the operation control signal LSA_EN is generated by a column decoder (not shown) that generates the column select line signal CSL. The operation control signal LSA_EN and the column select line signal CSL are transmitted via metal signal lines that are aligned parallel to each-other. Accordingly, the operation control signal LSA_EN has the same delay as the column select line signal CSL at any of the memory blocks.

Referring to FIG. 6, data amplified by a bit-line sense amplifier (not shown) is transmitted to the pair of local I/O lines LIO and LIOB when the column select line signal CSLi is activated in response to a read command R-COM. In addition, the read block selection signal BSEL_R is activated simultaneously with or prior to the activation of the column select line signal CSL. For convenience, FIG. 6 illustrates the case when the read block selection signal BSEL_R is activated prior to the activation of the column select line signal CSL. The read block selection signal BSEL_R is activated throughout the read operation.

When the operation control signal LSA_EN and the column select line signal CSL are activated, data of the pair of local I/O lines LIO and LIOB is amplified and transmitted to the pair of global I/O lines GIO and GIOB. The read data transmission unit 510 includes first through fifth read transistors RTR1, RTR2, RTR3, RTR4, and RTR5. When the read block selection signal BSEL_R is activated, the fifth read transistor RTR5 is turned on. Thereafter, the operation control signal LSA_EN and the column select line signal CSLi are activated simultaneously. Thus, the first and second read transistors RTR1 and RTR2 (i.e., a pair of read enable transistors) are turned on to transmit the data of the pair of local I/O lines LIO and LIOB to the pair of global I/O lines GIO and GIOB.

When the first column select line signal CSLi is deactivated, the operation control signal LSA_EN is also deactivated. Consequently from deactivation of the operation control signal LSA_EN, the precharge controller 520 precharges the pair of local I/O lines LIO and LIOB. The precharge controller 520 includes first through third precharge transistors PTR1, PTR2, and PTR3 (i.e., precharging switching devices).

A first end and a second end of the first precharge transistor PTR1 are connected to the pair of local I/O lines LIO and LIOB, respectively. The operation control signal LSA_EN is coupled to the gate of the first precharge transistor PTR1. A first end of the second precharge transistor PTR2 is connected to the local I/O line LIO, a second end is connected to a second node N2, and the operation control signal LSA_EN is applied to its gate.

A first end of the third precharge transistor PTR3 is connected to the second node N2, its second end is connected to the local I/O line LIOB, and the operation control signal LSA_EN is input to its gate. A predetermined voltage VBL is maintained at the second node N2. The predetermined voltage VBL is half a power supply voltage in one embodiment of the present invention.

When the operation control signal LSA_EN is deactivated to the logical low level, all of the first through third precharge transistors PTR1, PTR2, and PTR3 are turned on to precharge the pair of local I/O lines LIO and LIOB to VBL. When the column select line signal CSLi+1 is activated in response to a new read command R-COM, new data is transmitted to the pair of local I/O lines LIO and LIOB, and the operation control signal LSA_EN is activated again.

Then, the new data transmitted to the pair of local I/O lines LIO and LIOB is transmitted to the pair of global I/O lines GIO and GIOB via the read data transmission unit 510. According to the present invention, the column select line signal CSL and the operation control signal LSA_EN are activated or deactivated at the same time, thereby preventing the local sense amplifier 500 from reading and transmitting invalid data or unnecessarily consuming power.

During a write operation, the local sense amplifier 500 operates in a similar manner as during the read operation. Specifically, a column select line signal CSLi is activated in response to a write command W-COM. The write block selection signal BSEL_W is activated simultaneously with or prior to activation of the column select line signal CSLi. When write block selection signal BSEL_W is activated, the second and fourth write transistors WTR2 and WTR4 (i.e., write select transistors) of the write data transmission unit 530 are turned on.

The write block selection signal BSEL_W is activated using a combination of the row address signal and the write command W-COM. The write block selection signal BSEL_W is used only in selecting a memory block to which data is to be written, and thus does not limit the operating frequency range of the local sense amplifier 500.

The operation control signal LSA_EN is activated simultaneously with activation of the column select line signal CSLi. Consequently, the first and second write transistors WTR1 and WTR2 (i.e., a pair of write enable transistors) are turned on to transmit the data that was transmitted to the pair of global I/O lines GIO and GIOB to the pair of local I/O lines LIO and LIOB.

When the column select line signal CSLi is deactivated, the operation control signal LSA_EN is also deactivated such that the precharge controller 520 precharges the pair of local I/O lines LIO and LIOB. When a new column select line signal CSLi+1 is activated, the operation control signal LSA_EN is also activated and more transmitted data is written to the selected memory block.

In this manner, during the write operation, the operation control signal LSA_EN is activated or deactivated simultaneously with a column select line signal CSL, thereby preventing unnecessary power consumption by the local sense amplifier 500.

As previously mentioned, there are various signals, such as the read control signal PBLK_R, the write control signal PBLK_W, and the precharge control signal /PRE, that limit the operating frequency range of the conventional local sense amplifier 100 in FIG. 1. Since all of these signals are transmitted perpendicular to the column select line signal CSL in the prior art, it is not easy to control the timing of these signals to be simultaneous with the column select line signal CSL.

In contrast, there is only one signal, i.e., the operation control signal LSA_EN, that limits the operating frequency range of the local sense amplifier 500 according to the present invention. The operation control signal LSA-EN is generated by a column decoder (not shown) that also generates the column select line signal CSL. In addition, the operation control signal LSA_EN and the column select line signal CSL are transmitted in the same direction and along similar paths. Thus, the operation control signal LSA_EN and the column select line signal CSL are activated substantially simultaneously at any of the memory blocks.

Figure 7:
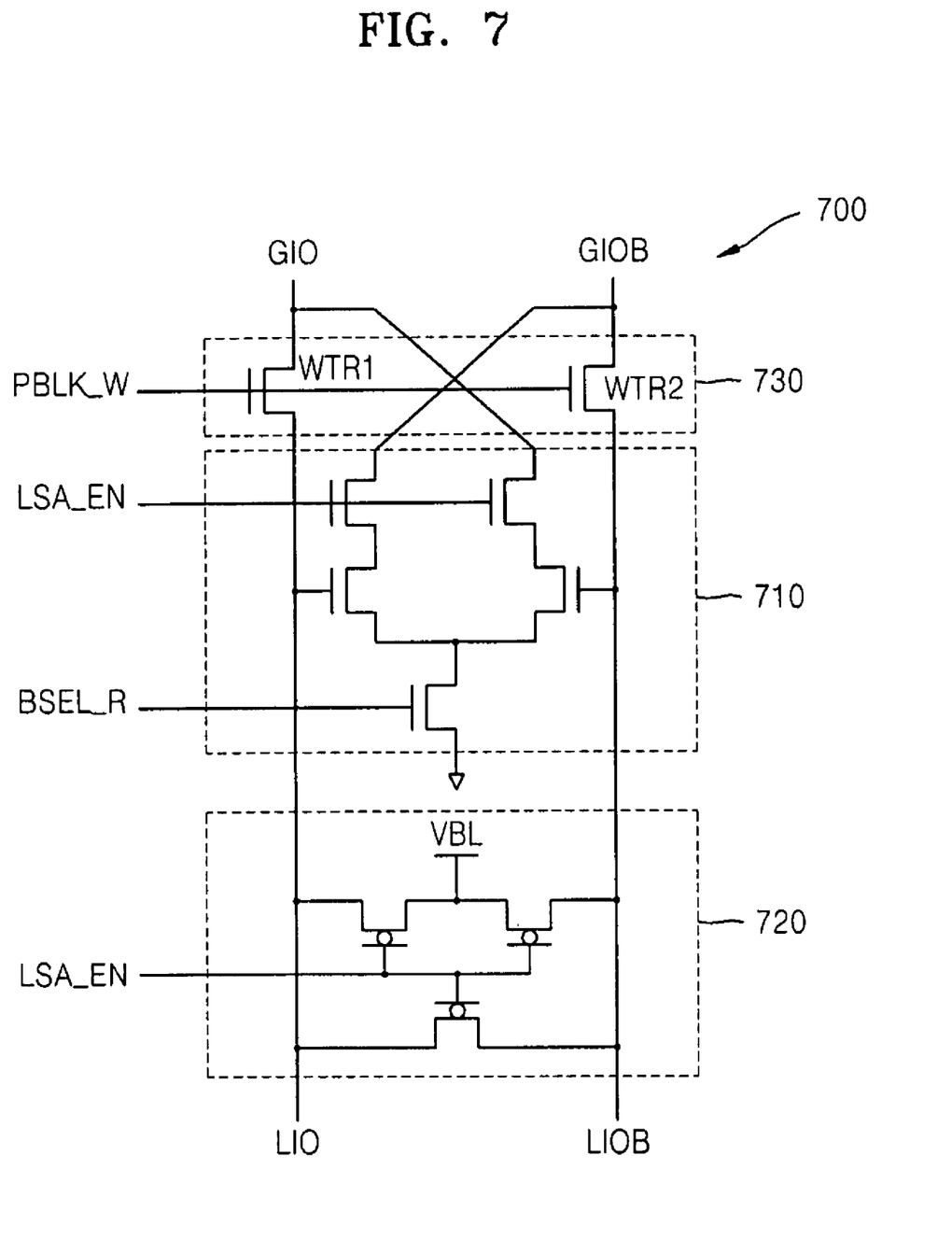
FIG. 7 is a circuit diagram of a local sense amplifier, according to another embodiment of the present invention.

FIG. 7 is a circuit diagram of a local sense amplifier 700 according to another embodiment of the present invention. The local sense amplifier 700 includes a read data transmission unit 710, a precharge controller 720, and a write data transmission unit 730.

The read data transmission unit 710 transmits data transmitted to a pair of local I/O lines LIO and LIOB, to a pair of global I/O lines GIO and GIOB, in response to a read block selection signal BSEL_R and an operation control signal LSA_EN that are at a first logical level. The precharge controller 720 precharges the pair of local I/O lines LIO and LIOB in response to the operation control signal LSA_EN that is at a second logical level.

The write data transmission unit 730 transmits the data transmitted to the pair of global I/O lines GIO and GIOB to the pair of local I/O lines LIO and LIOB in response to a write control signal PBLK_W. The write data transmission unit 730 includes first and second write transistors WTR1 and WTR2.

The operation and structure of the read data transmission unit 710 of FIG. 7 is similar to that of the read data transmission unit 510 of FIG. 5. The operation and structure of the precharge controller 720 of FIG. 7 is similar to that of the precharge controller 520 of FIG. 5. However, the operation and structure of the write data transmission unit 730 of FIG. 7 is similar to that of the conventional local sense amplifier 100 of FIG. 1.

Figure 8:
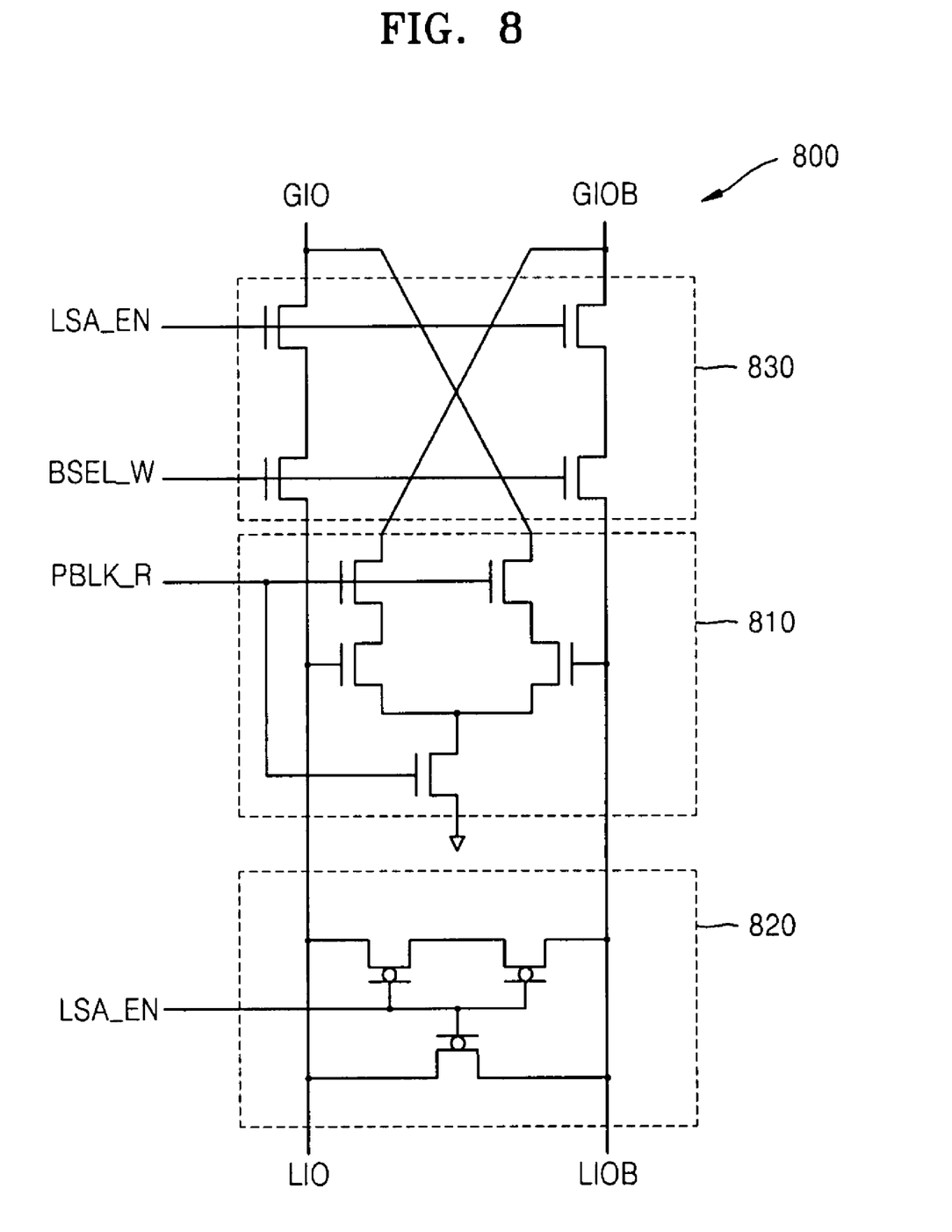
FIG. 8 is a circuit diagram of a local sense amplifier, according to yet another embodiment of the present invention.

FIG. 8 is a circuit diagram of a local sense amplifier 800 according to another embodiment of the present invention. The local sense amplifier 800 includes a read data transmission unit 810, a precharge controller 820, and a write data transmission unit 830.

The operation and structure of the write data transmission unit 830 of FIG. 8 is similar to that of the write data transmission unit 530 of FIG. 5. The operation and structure of the precharge controller 820 of FIG. 8 is similar to that of the precharge controller 520 of FIG. 5. However, the operation and structure of the read data transmission unit 810 of FIG. 8 is similar to that of the conventional local sense amplifier 100 of FIG. 1.

Figure 9:
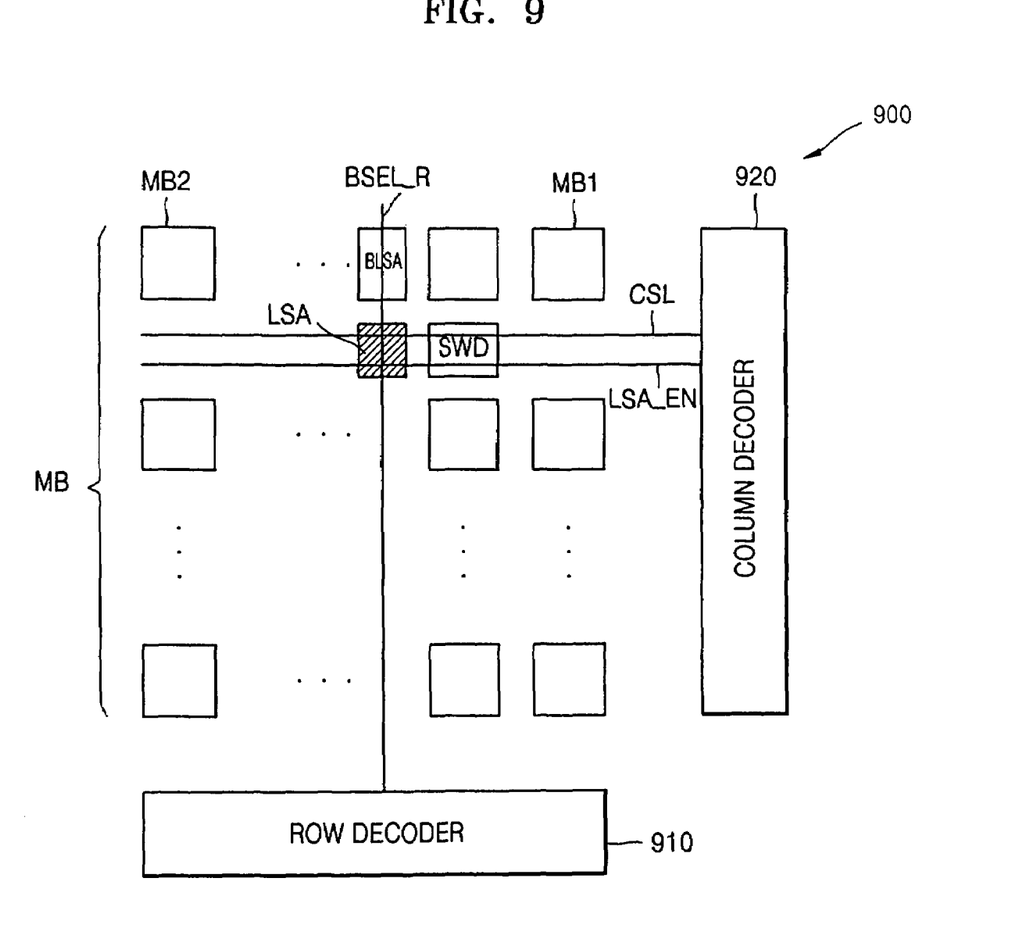
FIG. 9 is a block diagram of a semiconductor memory device, according to an embodiment of the present invention.
Figure 10:
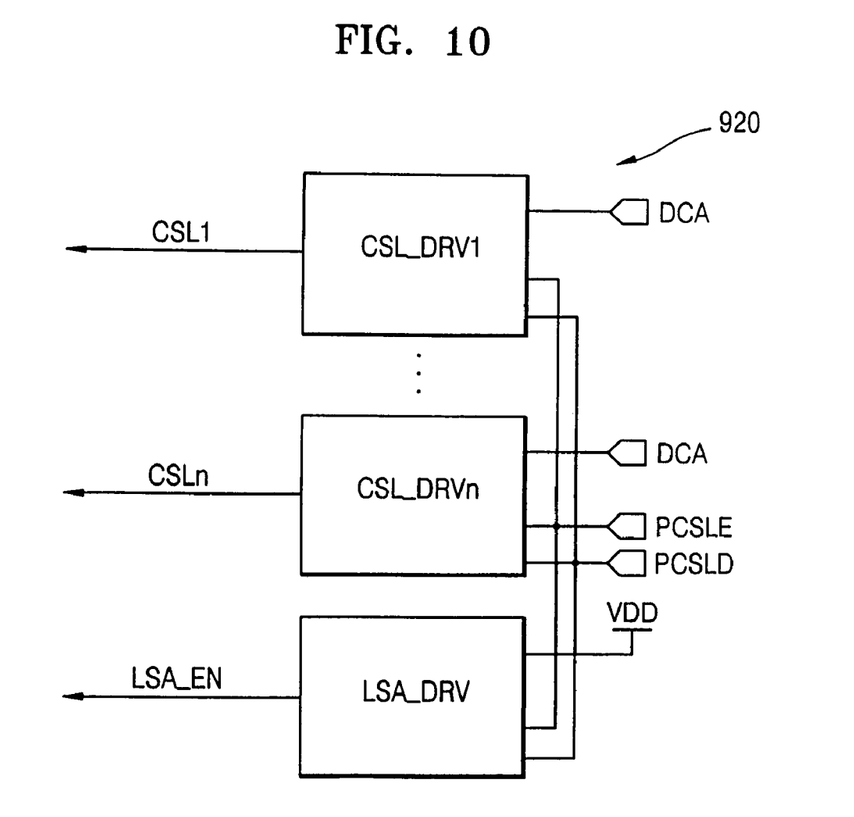
FIG. 10 is a block diagram of a column decoder of FIG. 9, according to an embodiment of the present invention.
Figure 11:
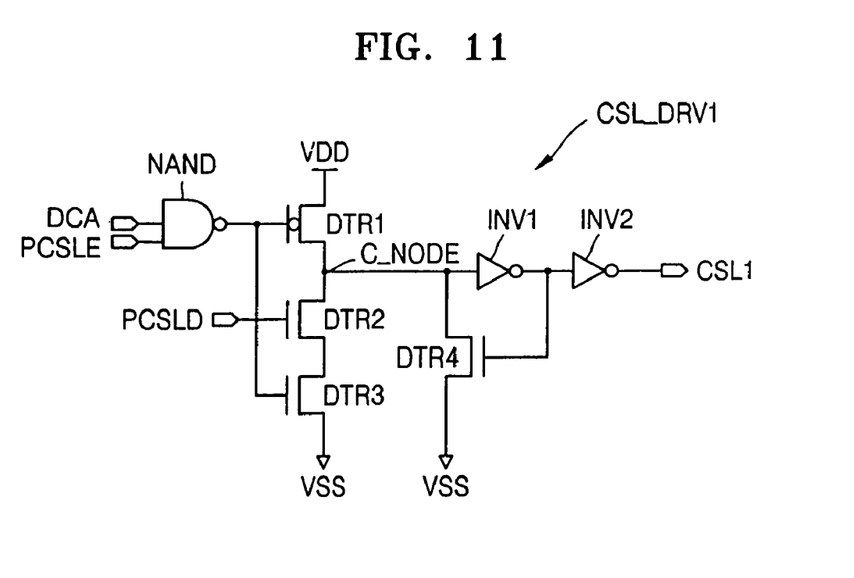
FIG. 11 is a circuit diagram of a column selection line driver of FIG. 10, according to an embodiment of the present invention.

FIG. 9 shows a block diagram of a semiconductor memory device 900 according to an embodiment of the present invention. FIG. 10 shows a block diagram of a column decoder 920 of FIG. 9. FIG. 11 shows a circuit diagram of an example one of the column selection line drivers CSL_DRV1, . . . , CSL_DRVn of FIG. 10.

The semiconductor memory device 900 includes a plurality of memory blocks MB, a pair of local I/O lines (not shown), a pair of global I/O lines (not shown), a row decoder 910, a column decoder 920, and a local sense amplifier LSA. The row decoder 910 selects a memory block connected to a word line from among the plurality of memory blocks MB. The column decoder 920 generates a column select line signal CSL and an operation control signal LSA_EN that connect a pair of bit lines (not shown) and the pair of local I/O lines of the local sense amplifier LSA.

The local sense amplifier LSA connects the pair of local I/O lines and the pair of global I/O lines, and writes data to or reads data from a selected memory block in response to a write block selection signal BSEL_W, a read block selection signal BSEL_R, and an operation control signal LSA_EN. The local sense amplifier LSA performs a write operation when both the write block selection signal BSEL_W and the operation control signal LSA_EN are activated, and performs a read operation when both the read block selection signal BSEL_R and the operation control signal LSA_EN are activated.

The read block selection signal BSEL_R enables selection of a memory block from which data is to be read, and is generated using a combination of a row address signal and a write command. The read block selection signal BSEL_R is activated simultaneously with or prior to the activation of the column select line signal CSL.

The write block selection signal BSEL_W enables selection of a memory block to which data is to be written, and is generated using a combination of the row address signal and a write command. The write block selection signal BSEL_W is activated simultaneously with or prior to the activation of the column select line signal CSL. The local sense amplifier LSA is installed at an area of intersection between a bit line sense amplifier BLSA of the selected memory block and a sub word line driver SWD.

The semiconductor memory device 900 with the local sense amplifier LSA will now be described in detail. The local sense amplifier LSA of FIG. 9 may be implemented as one of the local sense amplifiers 500, 700, and 800 of FIGS. 5, 7, and 8.

The operation control signal LSA_EN and the column select line signal CSL are activated or deactivated simultaneously and are transmitted via metal signal lines that are disposed in parallel along a same direction. The operation control signal LSA_EN is generated by the column decoder 920 and controls the operation of the local sense amplifier LSA. Referring to FIG. 10, the column decoder 920 includes first through $n^{th}$ column selection line drivers CSL_DRV1 through CSL_DRVn and an operation control signal driver LSA_DRV.

The first through $n^{th}$ column selection line drivers CSL_DRV1 through CSL_DRVn generate column select line signals CSL1 through CSLn, respectively, in response to a column address signal DCA, an activation master signal PCSLE, and a deactivation master signal PCSLD. The operation control signal driver LSA_DRV generates the operation control signal LSA_EN in response to the activation master signal PCSLE and the deactivation master signal PCSLD. The operation control signal LSA_EN is activated when the activation master signal PCSLE is activated, and deactivated when the deactivation master signal PCSLD is activated.

The column address signal DCA consists of multiple bits, and the first through $n^{th}$ column selection line drivers CSL_DRV1 through CSL_DRVn select memory blocks to which the column select line signals CSL1 through CSLn are to be transmitted, respectively, in response to the multiple-bit column address signal DCA. When the activation master signal PCSLE is activated, the first through $n^{th}$ column selection line drivers CSL_DRV1 through CSL_DRVn transmit the column selection signals CSL1 through CSLn to the selected memory blocks, respectively, and deactivate the column selection signals CSL1 through CSLn when the deactivation master signal PCSLD is activated.

The operation control signal driver LSA_DRV operates in the same way as the first through $n^{th}$ column selection line drivers CSL_DRV1 through CSL_DRVn, except that the operation control signal driver LSA_DRV does not receive the column address signal DCA. Thus, the operation control signal driver LSA_DRV activates the operation control signal LSA_EN when the activation master signal PCSLE is activated, and deactivates the operation control signal LSA_EN when the deactivation master signal PCSLD is activated.

Accordingly, when any one of the first through $n^{th}$ column selection line drivers CSL_DRV1 through CSL_DRVn activates its corresponding column selection line, the operation control signal driver LSA_DRV activates the operation control signal LSA_EN. When a column select line signal is deactivated in response to the deactivation master signal PCSLD, the operation control signal LSA_EN is also deactivated.

The construction and operation of the first column selection line driver CSL_DRV1 will now be described with reference to FIG. 11. The other column selection line drivers are implemented similarly. The first column selection line driver CSL_DRV1 includes a NAND gate and first through third driving transistors DTR1, DTR2, and DTR3.

The NAND gate performs a NAND operation on the column address signal DCA and the activation master signal PCSLE. A power supply voltage VDD is applied to a first end of the first driving transistor DTR1, an output of the NAND gate is input to the gate of DTR1, and a second end of DTR1 is connected to a connection node C_NODE.

A first end of the second driving transistor DTR2 is connected to the connection node C_NODE, and the deactivation master signal PCSLD is input to its gate. A first end of the third driving transistor DTR3 is connected to the second end of the second driving transistor DTR2, the output of the NAND gate is input to the gate of DTR3, and a ground voltage VSS is applied to the second end of DTR3. The column select line signal CSL1 is output from the first column selection line driver CSL_DRV via the connection node C_NODE.

When both the column address signal DCA and the activation master signal PCSLE are activated to the logical high level, the output of the NAND gate goes low. In this case, the first driving transistor DTR1 is turned on, the third driving transistor DTR3 is turned off, and a logical high-level signal is output at the connection node C_NODE. The logical high-level signal output at the connection node C_NODE is the activation of the column select line signal CSL1.

When the activation master signal PCSLE goes low and the deactivation master signal PCSLD goes high, the first driving transistor DTR1 is turned off and the second and third driving transistors DTR2 and DTR3 are turned on. In this case, the column select line signal CSL1 is deactivated to the logical low level.

The first column selection line driver CSL_DRV1 further includes first and second inverters INV1 and INV2 and a fourth driving transistor DTR4. The first inverter INV1 inverts the output at the connection node C_NODE. A first end of the fourth driving transistor DTR4 is connected to the connection node C_NODE, an output of the first inverter INVL is input to the gate of DTR4, and the ground voltage VSS is applied to the second end of DTR4. The second inverter INV2 inverts the output of the first inverter INV1 and outputs the result of inversion.

The fourth driving transistor DTR4 maintains the logic level of the output at the connection node C_NODE. The first and second inverters INV1 and INV2 increase the driving characteristics of the output at the connection node C_NODE.

The operation control signal driver LSA_DRV has similar construction as the first column selection line driver CSL_DRV1 of FIG. 11, except that it does not receive the column address signal DCA. In the semiconductor memory device of FIG. 9, the power supply voltage VDD is applied instead of the column address signal DCA. Thus, the operation control signal driver LSA_DRV is controlled by only the activation master signal PCSLE and the deactivation master signal PCSLD.

Figure 12:
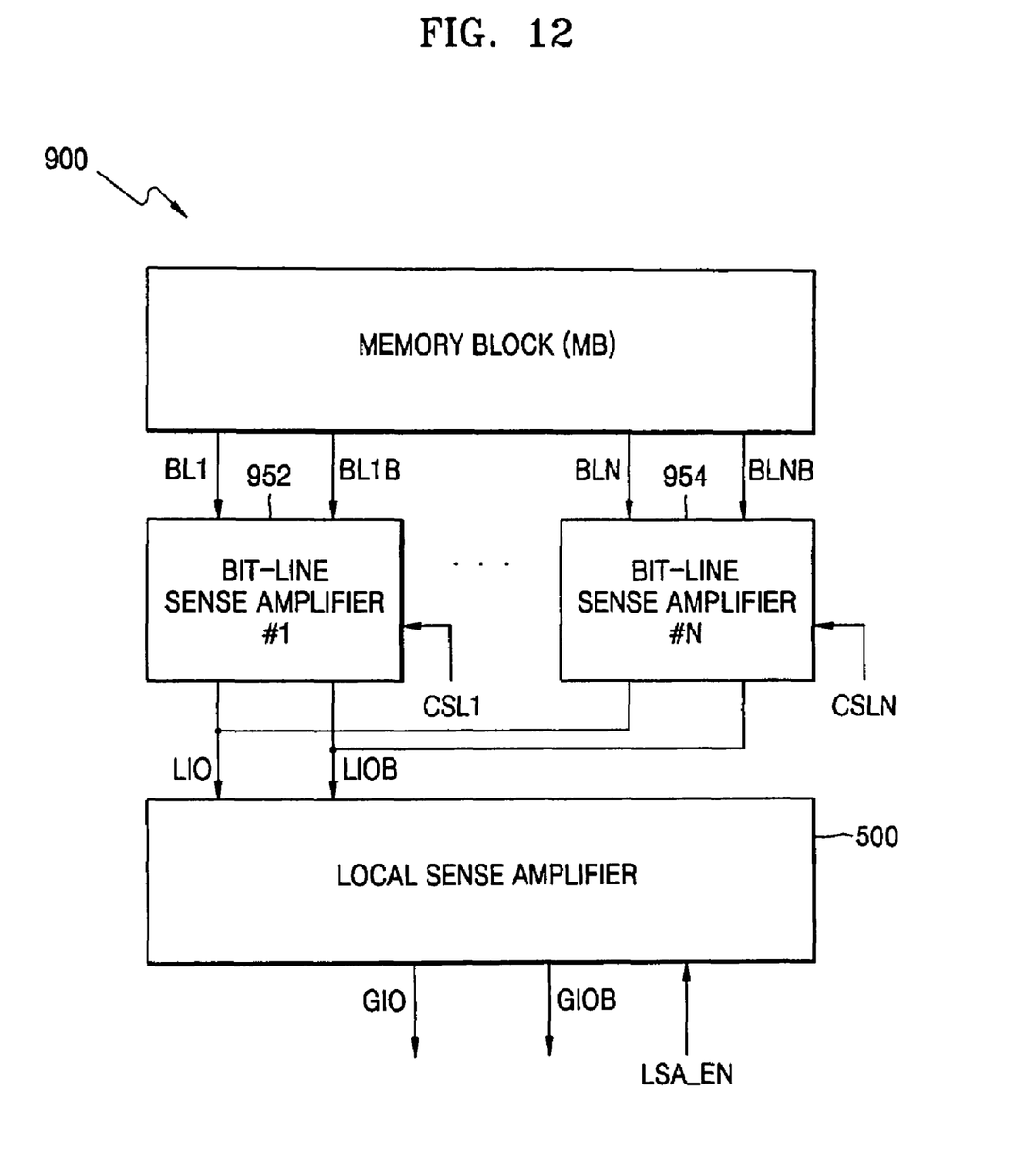
FIG. 12 is a block diagram of further components in the semiconductor memory device of FIG. 9, according to an embodiment of the present invention.

FIG. 12 shows further components of the semiconductor memory device 900 including a plurality of bit-line sense amplifiers. Each column select line signal CSLi is coupled to a respective one of the bit-line sense amplifiers. For example, a first column select line signal CSL1 is coupled to a first bit-line sense amplifier 952, and an Nth column select line signal CSLN is coupled to an Nth bit-line sense amplifier 954. When one of the column select line signals CSLi is activated, the corresponding bit-line sense amplifier receiving that activated column select line signals CSLi couples a corresponding pair of bit-lines to the pair of local I/O lines LIO and LIOB of the local sense amplifier 500.

In this manner, the column decoder 920 synchronizes activation of the control signal LSA_EN and the column select line signal CSL. In addition, because such signals LSA_EN and CSL are transmitted in parallel along similar paths, such signals LSA_EN and CSL are activated simultaneously at each of the memory blocks MB thereby eliminating restriction on the operating frequency range and preventing unnecessary power consumption for the local sense amplifier.

While this invention has been particularly shown and described with reference to exemplary embodiments thereof, it will be understood by those skilled in the art that various changes in form and details may be made therein without departing from the spirit and scope of the invention as defined by the appended claims. For example, other types of switching devices may be used for the transistors illustrated and described herein.

What is claimed is:

1. A method for performing local sense amplification, comprising:
   turning on at least one switching device with an operational control signal that is at a first logical level to couple at least one local I/O line to at least one global I/O line; and
   transmitting the operational control signal and a column select line signal via signal lines that are disposed to be parallel,
   wherein a first signal line of the parallel signal lines transmits the colunm select line signal for coupling respective bit lines to the at least one local I/O line,
   and wherein a second signal line of the parallel signal lines transmits the operational control signal to the at least one switching device within a local sense amplifier.

2. The method of claim 1, further comprising:
   setting the operational control signal and the column select line signal to the first logical level substantially simultaneously.

3. The method of claim 1, further including:
   turning on a pair of enable transistors forming the at least one switching device when the operational control signal is at the first logical level to couple read data between a pair of local I/O lines and a pair of global I/O lines for a read operation.

4. The method of claim 3, further including:
   turning on a read select transistor of the local sense amplifier when a read block select signal is at the first logical level as the operation control signal is at the first logical level for the read operation.

5. The method of claim 3, further including:
   turning on another pair of enable transistors forming the at least one switching device when the operational control signal is at the first logical level to couple write data between a pair of local I/O lines and a pair of global I/O lines for a write operation.

6. The method of claim 5, further including:
   turning on write select transistors of the local sense amplifier when a write block select signal is at the first logical level as the operation control signal is at the first logical level for the write operation.

7. The method of claim 1, further including:
   turning on a pair of enable transistors forming the at least one switching device when the operational control signal is at the first logical level to couple write data between a pair of local I/O lines and a pair of global I/O lines for a write operation.

8. The method of claim 7, wherein the local sense amplifier further includes:
   turning on write select transistors of the local sense amplifier when a write block select signal is at the first logical level as the operation control signal is at the first logical level for the write operation.

9. The method of claim 1, wherein the local sense amplifier further includes:
   turning on at least one precharge switching device of the local sense amplifier when the operation control signal is at a second logical level for precharging the at least one local I/O line.

10. A method of operating a memory device, comprising:
    setting an operational control signal at a first logical level from a decoder;
    turning on at least one switching device of a local sense amplifier with the operational control signal that is at the first logical level to couple at least one local I/O line to at least one global I/O line; and
    transmitting the operational control signal and a column select line signal from the decoder via signal lines that are disposed to be parallel,
    wherein a first signal line of the parallel signal lines transmits the column select line signal for coupling respective bit lines to the at least one local I/O line,
    and wherein a second signal line of the parallel signal lines transmits the operational control signal to the at least one switching device within the local sense amplifier.

11. The method of claim 10, further comprising:
    setting the operational control signal and the column select line signal at the first logical level substantially simultaneously from the decoder.

12. The method of claim 11, further comprising:
    coupling a respective at least one bit line to the at least one local I/O line when the column select line signal is at the first logical level.

13. The method of claim 10, further comprising:
    turning on a pair of enable transistors comprising the at least one switching device when the operational control signal is at the first logical level to couple read data between a pair of local I/O lines and a pair of global I/O lines for a read operation.

14. The method of claim 13, further including:
    turning on a read select transistor of the local sense amplifier when a read block select signal is at the first logical level as the operation control signal is at the first logical level for the read operation.

15. The method of claim 13, further including:
    turning on another pair of enable transistors forming the at least one switching device when the operational control signal is at the first logical level to couple write data between a pair of local I/O lines and a pair of global I/O lines for a write operation.

16. The method of claim 15, further including:
    turning on write select transistors of the local sense amplifier when a write block select signal is at the first logical level as the operation control signal is at the first logical level for the write operation.

17. The method of claim 10, further including:
    turning on a pair of enable transistors forming the at least one switching device when the operational control signal is at the first logical level to couple write data between a pair of local I/O lines and a pair of global I/O lines for a write operation.

18. The method of claim 17, further including:
    turning on write select transistors of the local sense amplifier when a write block select signal is at the first logical level as the operation control signal is at the first logical level for the write operation.

19. The method of claim 10, further including:
    turning on at least one precharge switching device of the local sense amplifier when the operation control signal is at a second logical level for precharging the at least one local I/O line.

* * * * *